(12) United States Patent
Roy et al.

(10) Patent No.: US 10,529,568 B2
(45) Date of Patent: Jan. 7, 2020

(54) PECVD TUNGSTEN CONTAINING HARDMASK FILMS AND METHODS OF MAKING

(71) Applicant: Applied Materials, Inc., Santa Clara, CA (US)

(72) Inventors: Susmit Singha Roy, Mountain View, CA (US); Pramit Manna, Sunnyvale, CA (US); Rui Cheng, Santa Clara, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 210 days.

(21) Appl. No.: 15/406,116

(22) Filed: Jan. 13, 2017

(65) Prior Publication Data

US 2017/0207087 A1    Jul. 20, 2017

Related U.S. Application Data

(60) Provisional application No. 62/279,741, filed on Jan. 16, 2016.

(51) Int. Cl.
*H01L 21/033* (2006.01)
*H01L 21/02* (2006.01)
*H01L 21/3205* (2006.01)
*H01L 21/768* (2006.01)

(52) U.S. Cl.
CPC .... *H01L 21/0332* (2013.01); *H01L 21/02175* (2013.01); *H01L 21/02274* (2013.01); *H01L 21/02304* (2013.01); *H01L 21/0337* (2013.01); *H01L 21/32051* (2013.01); *H01L 21/76876* (2013.01)

(58) Field of Classification Search
CPC ................................................ H01L 21/02175
See application file for complete search history.

(56) References Cited

U.S. PATENT DOCUMENTS

| 7,544,597 | B2 | 6/2009 | Park et al. |
| 8,629,062 | B2 | 1/2014 | Ha et al. |
| 2002/0081861 | A1 | 6/2002 | Robinson et al. |
| 2005/0064299 | A1 | 3/2005 | Lu et al. |
| 2006/0237816 | A1* | 10/2006 | Nakajima ......... H01L 21/28079 257/500 |
| 2006/0264031 | A1* | 11/2006 | Xi ....................... C23C 16/0272 438/627 |

(Continued)

FOREIGN PATENT DOCUMENTS

JP    2013032575 A    2/2013

OTHER PUBLICATIONS

PCT International Search Report and Written Opinion in PCT/US2017/013467 dated Apr. 28, 2017, 12 pages.

(Continued)

*Primary Examiner* — Joseph A Miller, Jr.
(74) *Attorney, Agent, or Firm* — Servilla Whitney LLC

(57) ABSTRACT

Methods of forming a tungsten film comprising forming a boron seed layer on an oxide surface, an optional tungsten initiation layer on the boron seed layer and a tungsten containing film on the boron seed layer or tungsten initiation layer are described. Film stack comprising a boron seed layer on an oxide surface with an optional tungsten initiation layer and a tungsten containing film are also described.

12 Claims, 1 Drawing Sheet

(56) References Cited

U.S. PATENT DOCUMENTS

| | | |
|---|---|---|
| 2007/0072418 A1 | 3/2007 | Lee et al. |
| 2007/0148943 A1 | 6/2007 | Kim et al. |
| 2009/0163025 A1* | 6/2009 | Humayun ............... C23C 16/30 438/675 |
| 2009/0200672 A1 | 8/2009 | Kim et al. |
| 2014/0011358 A1 | 1/2014 | Chen et al. |
| 2014/0154883 A1 | 6/2014 | Humayun et al. |
| 2015/0072516 A1 | 3/2015 | Xue et al. |

OTHER PUBLICATIONS

PCT International Preliminary Report on Patentability in PCT/US2017/013467 dated Jul. 26, 2018, 9 pages.

\* cited by examiner

PECVD TUNGSTEN CONTAINING HARDMASK FILMS AND METHODS OF MAKING

CROSS-REFERENCE TO RELATED APPLICATIONS

This application claims priority to U.S. Provisional Application No. 62/279,741, filed Jan. 16, 2016, the entire disclosure of which is hereby incorporated by reference herein.

TECHNICAL FIELD

The present disclosure relates generally to hardmask films and methods of depositing hardmask films. In particular, the disclosure relates to tungsten containing hardmask films and processes for the deposition of same.

BACKGROUND

As the feature size of the device patterns get smaller, the critical dimension (CD) requirement of features becomes a more important criterion for stable and repeatable device performance. Allowable CD variation across a substrate has also scaled with the scaling of feature CD. With lateral dimensions scaling faster than vertical dimensions, because of issues such as device capacitance, high aspect ratios (HAR) are now prevalent in the industry. When such demanding aspect ratios and CD control are compounded with requirements of high etch selectivity, sidewall smoothness and high tool throughput, the process window for any hardware configuration can become very small. In many situations, a small process window can be found only when a number of process gases are incorporated into a complex etchant gas mixture combined with extreme hardware settings, such as very high RF bias powers, to achieve a fragile balance between sidewall passivation, etch rate and mask selectivity. However, such small process windows typically suffer from performance limitations which cannot be tuned out of the etch process with known means.

Fabrication techniques often now employ a mask stack that includes a hardmask. A hardmask may be employed in the etching of high aspect ratio feature. The use of a hardmask may allow for deeper features that conventional photoresist materials cannot withstand.

Tungsten carbide (WC) films have been experimentally shown to have a high etch selectivity as a hardmask. Typically, WC films are manufactured by physical vapor deposition (PVD). These PVD films are often very rough and have a high cost of ownership (COO).

Manufacturing of plasma-enhanced chemical vapor deposition (PECVD) based WC films typically involves the use of hydrogen, a hydrocarbon source, argon, helium and a tungsten precursor. Tungsten hexafluoride ($WF_6$) is a promising tungsten precursor due to a low cost, gaseous nature and scalability for mass production. However, the presence of fluorine in the precursor substantially lowers the adhesion to the underlayer due to the presence of fluorine based by-products like HF and CF in the process. These by-products cause the film to delaminate even under subsequent thermal stress in neutral atmospheres (e.g., 550° C. for 30 minutes in $N_2$). Additionally, the presence of metal in the amorphous carbon leads to granular and rough surface morphology.

Therefore, there is a need in the art for cost effective methods of depositing tungsten-containing hardmask films with lower surface roughness.

SUMMARY

One or more embodiments of the disclosure are directed to methods of forming a tungsten containing film. The methods comprise providing a substrate having an oxide surface. A boron seed layer is formed on the oxide surface. A tungsten initiation layer is formed on the boron seed layer. A tungsten containing film is formed on the tungsten initiation layer.

Additional embodiments of the disclosure are directed to methods of forming a tungsten containing film. The methods comprise providing a silicon substrate having a silicon oxide surface. A boron seed layer is formed on the silicon oxide surface by a first PECVD process. The boron seed layer has a thickness in the range of about 10 Å to about 200 Å. The PECVD process comprises exposing the silicon oxide surface to a first reactive gas comprising $B_2H_6$, $H_2$ and Ar. The PECVD process includes a RF plasma generated at a frequency of about 13.56 MHz with a power in the range of about 300 Watt to about 700 Watt and a pressure in the range of about 2 Torr to about 10 Torr. An optional tungsten initiation layer is formed on the boron seed layer by a second PECVD process. The tungsten initiation layer has a thickness in the range of about 10 Å to about 200 Å. The second PECVD process comprises exposing the boron seed layer to a second reactive gas comprising $WF_6$, $H_2$ and Ar. The PECVD process includes a RF plasma generated at a frequency of about 13.56 MHz with a power in the range of about 300 Watt to about 700 Watt and a pressure in the range of about 2 to about 10 Torr. A tungsten carbide film is formed on the boron seed layer or the tungsten initiation layer by a third PECVD process. The tungsten carbide film has a thickness greater than about 2000 Å. The third PECVD process comprises exposing the tungsten initiation layer to a third reactive gas comprising $WF_6$, $H_2$ and $C_3H_6$ with a RF plasma generated at a frequency of about 13.56 MHz with a power in the range of about 300 Watt to about 700 Watt and at a pressure in the range of about 2 to about 10 Torr.

Further embodiments of the disclosure are directed to stacks comprising a substrate having an oxide surface. A boron seed layer is on the oxide surface. The boron seed layer has a thickness in the range of about 10 Å to about 200 Å. An optional tungsten initiation layer is on the boron seed layer. The tungsten initiation layer has a thickness in the range of about 10 Å to about 200 Å. A tungsten containing film is on the boron seed layer or the optional tungsten initiation layer. The tungsten containing film has a thickness greater than about 2000 Å.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Embodiments of the disclosure provide methods of depositing a tungsten carbide hardmask film that adheres to the underlayer. The inventors have found that WC films with a thickness up to 2 μm can be adhered to a bare silicon substrate with an ultra-thin tungsten initiation layer (<100 Å). Some embodiments of the disclosure are directed to methods of depositing tungsten containing films (e.g., WC, WB, WN, WCN, WBC, WBN and W).

Tungsten films generally do not grow directly on oxide surfaces. In some embodiments, an oxide surface is treated with an amorphous boron seed layer thereon. The tungsten initiation layer can be grown on the amorphous boron seed layer.

Some embodiments advantageously provide tungsten carbide films with low root mean square (RMS) surface roughness of 0.65 nm for 20% W and 0.97 nm for 30% W. One or more embodiments advantageously provide films with better properties for lithography and etching in the patterning process. Embodiments of the disclosure provide economical and reliable methods of depositing WC hardmask films on oxide surfaces.

Figure 1:
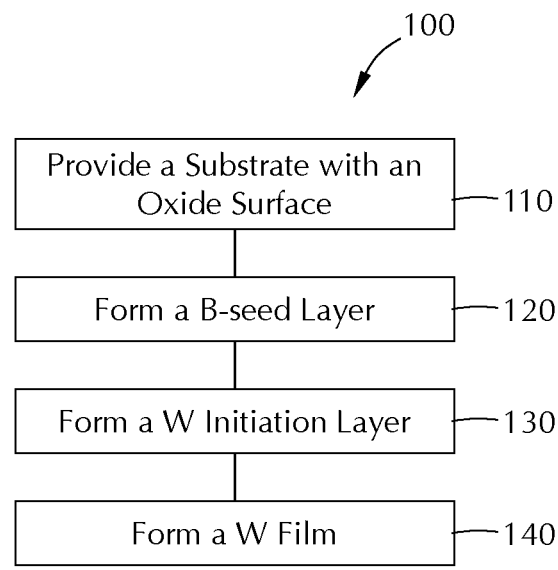
FIG. 1 shows a process scheme in accordance with one or more embodiment of the disclosure.
Figure 2:
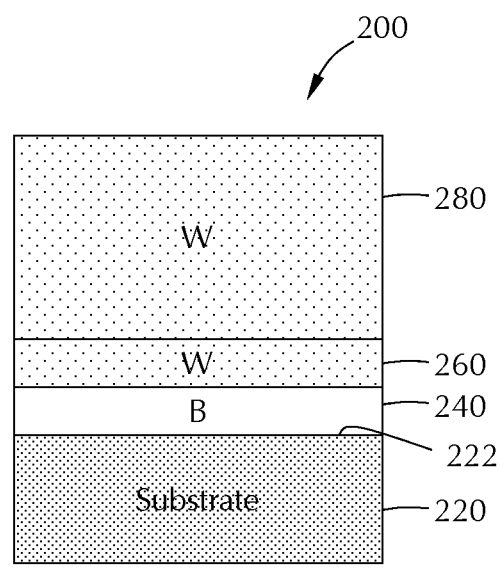
FIG. 2 shows a schematic of a film stack in accordance with the process scheme of FIG. 1.

In one or more embodiments, a tungsten containing film is manufactured using a RF based plasma enhanced chemical vapor deposition process (PECVD). With reference to FIGS. 1 and 2, one or more embodiments of the disclosure are directed to methods 100 of forming a stack 200 including a tungsten containing film. Many embodiments of the disclosure are discussed with respect to the formation of a tungsten carbide (WC) film. This is merely representative of one possible configuration and process. The use of tungsten carbide for descriptive purposes should not be taken as limiting the scope of the disclosure to just WC. Those skilled in the art will understand that the tungsten film can be, for example, WC, WB, WN, WBC, WBN, WCN or W.

At 110, a substrate 220 is provided that includes an oxide surface 222. The oxide surface 222 can be any suitable oxide including, but not limited to, silicon oxide. In some embodiments, the substrate 220 comprises silicon and the oxide surface 222 comprises silicon oxide. The oxide surface 222 can be a native oxide or a grown oxide. For example, the surface may form a native oxide due to exposure to air or can be oxidized to form an oxide film with a predetermined thickness.

At 120, the formation of the tungsten containing film comprises formation of boron seed layer 240 on the oxide surface 222. The amorphous boron seed layer 240 may be deposited by co-flowing a boron precursor with one or more reactant in the presence of an RF plasma. Though an amorphous B film can also be formed in the absence of the RF plasma (i.e., by thermal CVD), the inventors have surprisingly found that the use of RF-plasma improves the adhesion of a WC film where the thermal CVD boron film was less effective. For example, when a thermal based B-seed layer was used, the subsequent WC film was observed to delaminate under thermal stress.

Suitable boron precursors include, but are not limited to, diborane ($B_2H_6$).

In one or more embodiment, the oxide surface is exposed to a reactive gas. The reactive gas comprises a mixture of $B_2H_6$, $H_2$ and Ar that are co-flowed into a process region of a processing chamber. The reactive gas used to form the boron seed layer may be referred to as a first reactive gas to distinguish the gas composition and conditions from other reactive gas processes.

The PECVD process used to deposit the boron seed layer includes an RF plasma generated at a predetermined frequency with a predetermined power and pressure. The plasma frequency can be any suitable frequency including, but not limited to, 2 MHz, 13.56 MHz, 40 MHz, 60 MHz and 100 MHz. In some embodiments, the plasma frequency is about 13.56 MHz.

In some embodiments, the power of the RF plasma used in any or all of the process stages is less than about 1000 Watts. In some embodiments, any of the PECVD process stages use an RF power in the range of about 100 Watt to about 900 Watt, or in the range of about 200 Watt to about 800 Watt, or in the range of about 300 Watt to about 700 Watt, or in the range of about 400 Watt to about 600 Watt. In some embodiments, the RF power is about 500 Watts.

The pressure of the RF plasma can be any suitable pressure. For example the pressure may be in the range of about 1 Torr to about 50 Torr. In some embodiments, the pressure is in the range of about 2 Torr to about 10 Torr. In one or more embodiments, the pressure is greater than 1 Torr and is less than 50 Torr, 40 Torr, 30 Torr or 20 Torr.

The oxide surface 222 can be exposed to the RF plasma for any suitable time depending on, for example, the process conditions and the predetermined thickness of the boron seed layer 240. In some embodiments, the oxide surface 222 is exposed to the PECVD process for a time in the range of about 1 second to about 20 seconds. In some embodiments, the oxide surface 222 is exposed to the PECVD process for less than about 10 seconds.

The thickness of the boron seed layer 240 can vary depending on, for example, the predetermined thickness of the tungsten containing film to be deposited. In some embodiments, the boron seed layer 240 has a thickness in the range of about 10 Å to about 200 Å. In one or more embodiments, the boron seed layer has a thickness in the range of about 10 Å to about 100 Å. In various embodiments, the boron seed layer 240 has a thickness less than about 200 Å, 150 Å, 100 Å or 75 Å. In some embodiments, the boron seed layer 240 has a thickness greater than about 10 Å, 20 Å, 30 Å, 40 Å, 50 Å, 60 Å, 70 Å, 80 Å, 90 Å or 100 Å.

At 130, after formation of the boron seed layer 240, an optional tungsten initiation layer 260 may be formed on the boron seed layer 240. The inventors have surprisingly found that the boron seed layer 240 allowed for formation of the tungsten initiation layer 260 or a tungsten containing hardmask film. The tungsten initiation layer 260 was observed to not form well on the oxide surface 222 without the boron seed layer 240.

The tungsten initiation layer 260 of some embodiments comprises a substantially pure tungsten film on top of the boron seed layer 240. Those skilled in the art will understand that the bottom portion of the tungsten film may diffuse with the top of the boron seed layer 240. As used in this specification and the appended claims, the term "substantially pure tungsten film" means that the top half of the tungsten film is greater than about 90 atomic % tungsten, 95 atomic % tungsten or 98 atomic % tungsten.

In one or more embodiment, the boron seed layer 240 is exposed to a reactive gas comprising a mixture of $WF_6$, $H_2$ and Ar that are co-flowed into a process region of a processing chamber. The reactive gas used to form the tungsten initiation layer 260 may be referred to as a second reactive gas to distinguish the gas composition and conditions from other reactive gas processes. In some embodiments, the $H_2$ and $WF_6$ in the reactive gas are present in a ratio ($H_2$:$WF_6$) in the range of about 10:1 to about 50:1, or in the range of about 15:1 to about 30:1, or about 20:1.

The PECVD process used to deposit the tungsten initiation layer 260 includes an RF plasma generated at a predetermined frequency with a predetermined power and pressure. The plasma frequency can be any suitable frequency including, but not limited to, 2 MHz, 13.56 MHz, 40 MHz, 60 MHz and 100 MHz. In some embodiments, the plasma frequency is about 13.56 MHz.

In some embodiments, the power of the RF plasma used to deposit the tungsten initiation layer 260 is less than about 1000 Watts. In some embodiments, any of the PECVD process stages use an RF power in the range of about 100 Watt to about 900 Watt, or in the range of about 200 Watt to about 800 Watt, or in the range of about 300 Watt to about 700 Watt, or in the range of about 400 Watt to about 600 Watt. In some embodiments, the RF power is about 500 Watts.

The pressure of the RF plasma can be any suitable process pressure. For example the pressure may be in the range of about 1 Torr to about 50 Torr. In some embodiments, the pressure is in the range of about 2 Torr to about 10 Torr. In one or more embodiments, the pressure is greater than 1 Torr and is less than 50 Torr, 40 Torr, 30 Torr or 20 Torr.

The boron seed layer 240 can be exposed to the RF plasma for any suitable time depending on, for example, the process conditions and the predetermined thickness of the tungsten initiation layer 260 being deposited. In some embodiments, the boron seed layer 240 is exposed to the PECVD process for a time in the range of about 1 second to about 30 seconds. In some embodiments, the boron seed layer 240 is exposed to the PECVD process for about 10 seconds to form the tungsten initiation layer 260.

The thickness of the tungsten initiation layer 260 can vary depending on, for example, the predetermined thickness of the WC film to be deposited. In some embodiments, the tungsten initiation layer 260 has a thickness in the range of about 10 Å to about 200 Å. In one or more embodiments, the tungsten initiation layer 260 has a thickness in the range of about 10 Å to about 100 Å. In various embodiments, the tungsten initiation layer 260 has a thickness less than about 200 Å, 150 Å, 100 Å or 75 Å. In some embodiments, the tungsten initiation layer 260 has a thickness greater than about 10 Å, 20 Å, 30 Å, 40 Å, 50 Å, 60 Å, 70 Å, 80 Å, 90 Å or 100 Å.

The combined thickness of the boron seed layer 240 and the tungsten initiation layer 260 can vary depending on, for example, the predetermined thickness of the hardmask to be deposited. In some embodiments, the combined thickness of the boron seed layer 240 and the tungsten initiation layer 260 is less than about 300 Å. In various embodiments, the combined thickness of the boron seed layer 240 and the tungsten initiation layer 260 is less than or equal to about 250 Å, 200 Å, 150 Å or 100 Å. In some embodiments, the combined thickness of the boron seed layer 240 and the tungsten initiation layer 260 is greater than or equal to about 100 Å, 150 Å, 200 Å, 250 Å, 300 Å, 350 Å, 400 Å or 500 Å. The ratio of the thickness of the boron seed layer 240 and the tungsten initiation layer 260 can be in the range of about 1:10 to about 10:1, or in the range of about 1:5 t about 5:1 or in the range of about 1:2 to about 2:1, or about 1:1.

In some embodiments, there is no tungsten initiation layer 260 and the process skips 130. In embodiments of this sort, the layer formed in 140 is formed directly on the boron seed layer 240.

At 140, after formation of the tungsten initiation layer 260 or, if no tungsten initiation layer 260 is present, then after the formation of the boron seed layer 240, a tungsten containing film 280 can be formed. The tungsten containing film 280 is also referred to as a hardmask layer.

In some embodiments, the tungsten containing film 280 comprises a tungsten carbide film. The hardmask layer can be formed by a reactive gas made by co-flowing $WF_6$, $H_2$, Ar and $C_3H_6$ under the presence of RF plasma. The $C_3H_6$ flow can be ramped up from no flow to a predetermined value within the first few seconds of the process. The atomic percent tungsten in the hardmask can be tuned by varying the ratio of $C_3H_6$:$WF_6$ during the process.

In some embodiments, the tungsten containing film 280 comprises one or more of WC, WB, WN, WBC, WBN or WCN. Those skilled in the art will understand that the reactive gas may have different reactants than $C_3H_6$ to include, for example, boron or nitrogen atoms.

In some embodiments, the flow of $C_3H_6$ (or boron or nitrogen reactant) in the reactive gas is ramped up to a final predetermined flow rate over a time in the range of about 2 seconds to about 10 seconds. In some embodiments, the flow of $C_3H_6$ is ramped to a predetermined value in about 8 seconds, 7 seconds, 6 seconds, 5 seconds, 4 seconds or 3 seconds.

The PECVD process used to deposit the tungsten containing film 280 includes an RF plasma generated at a predetermined frequency with a predetermined power and pressure. The plasma frequency can be any suitable frequency including, but not limited to, 2 MHz, 13.56 MHz, 40 MHz, 60 MHz and 100 MHz. In some embodiments, the plasma frequency is about 13.56 MHz.

In some embodiments, the power of the RF plasma used to deposit the tungsten containing film 280 is less than about 1000 Watts. In some embodiments, any of the the PECVD process stages use an RF power in the range of about 100 Watt to about 900 Watt, or in the range of about 200 Watt to about 800 Watt, or in the range of about 300 Watt to about 700 Watt, or in the range of about 400 Watt to about 600 Watt. In some embodiments, the RF power is about 500 Watts.

The pressure of the RF plasma can be any suitable process pressure. For example the pressure may be in the range of about 1 Torr to about 50 Torr. In some embodiments, the pressure is in the range of about 2 Torr to about 10 Torr. In one or more embodiments, the pressure is greater than or equal to about 1 Torr and is less than or equal to about 50 Torr, 40 Torr, 30 Torr or 20 Torr.

The tungsten initiation layer 260 or the boron seed layer 240 if no tungsten initiation layer 260 is used, can be exposed to the RF plasma for any suitable time depending on, for example, the process conditions and the predetermined thickness of the tungsten containing film 280 being deposited. In some embodiments, the tungsten initiation layer 260 or the boron seed layer 240 is exposed to the PECVD process for a time in the range of about 1 second to about 30 seconds. In some embodiments, the boron seed layer 240 is exposed to the PECVD process for about 10 seconds to form the tungsten containing film 280.

The thickness of the tungsten containing film 280 can be varied depending on, for example, the process conditions of the tungsten containing film deposition. In some embodiments, the tungsten containing film 280 has a thickness greater than or equal to about 1000 Å, 2000 Å, 3000 Å, 4000 Å, 5000 Å, 6000 Å, 7000 Å, 8000 Å, 9000 Å or 10000 Å.

The temperature at which each of the process stages occurs can be the same or different from any other process stage. The temperature can be varied depending on, for example, the thermal budget of the device being formed. In some embodiments, formation of the boron seed layer 240, the tungsten initiation layer 260 and the tungsten containing film 280 occurs at a temperature in the range of about 100° C. to about 700° C., or in the range of about 200° C. to about 600° C., or in the range of about 300° C. to about 500° C., or about 400° C.

EXAMPLE

A silicon substrate with silicon oxide layer with a thickness of about 1000 Å was positioned in a processing chamber. The substrate was exposed to 4800 sccm $H_2$, 2000 sccm $B_3H_6$ and 1500 sccm Ar with a 13.56 MHz plasma at 500 Watt at about 400° C. The substrate was exposed for about 6 seconds in a total pressure of about 4 Torr to form an amorphous boron seed layer with a thickness less than 100 Å on the substrate.

The amorphous boron seed layer was exposed to 4800 sccm $H_2$, 210 sccm $WF_6$ and 1500 sccm Ar with a 13.56 MHz plasma at 500 Watt at about 400° C. for about 10 seconds to deposit a tungsten initiation layer having a thickness less than about 100 Å on the boron seed layer.

A tungsten carbide hardmask was formed by exposing the substrate to 4800 sccm $H_2$, 1500 sccm $C_3H_6$, 210 sccm $WF_6$ and 1500 sccm Ar with a 13.56 MHz plasma at 500 Watt at about 400° C. for about 200 seconds. The $C_3H_6$ flow was ramped up to 1500 sccm at a rate of 300 sccm/second over about 5 seconds. The tungsten carbide hardmask had a thickness of about 20000 Å and a tungsten composition of about 20 atomic %.

WC hardmask films were deposited by similar a similar process to form hardmask films with 15 atomic % W, 25 atomic % W and 35 atomic % W. The carbon, tungsten and hydrogen content of these films were determined. It was observed that the amount of hydrogen in the hardmask decreased with increasing tungsten.

WC films were formed with a W content of 15 atomic % and 30 atomic % using $WF_6$ and $W(CO)_6$ as the tungsten precursor. The RMS roughness of the 15 atomic % film was 0.65 nm for the $WF_6$ process versus 1.4 nm for the $W(CO)_6$ process; a reduction of about 50%. The RMS roughness of the 30 atomic % film was 0.97 nm for the $WF_6$ process versus 2.7 nm for the $W(CO)_6$ process; a reduction of about 70%.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a tungsten containing film, the method comprising:
   providing a silicon substrate having a silicon oxide surface;
   forming a boron seed layer on the silicon oxide surface;
   forming a tungsten initiation layer on the boron seed layer; wherein the tungsten initiation layer comprises substantially pure tungsten; and
   forming a tungsten containing film on the tungsten initiation layer,
   wherein the tungsten containing film comprises tungsten carbide having a thickness greater than about 8000 A and forming the tungsten carbide film comprises exposing the tungsten initiation layer to a reactive gas comprising WF6, H2 and C3H6 in a PECVD process including a RF plasma with a power of less than about 1000 Watt at a pressure in the range of about 2 to about 10 Torr, and
   wherein the C3H6 in the reactive gas is ramped up to a final predetermined flow rate over a time in the range of about 2 seconds to about 10 seconds.

2. The method of claim 1, wherein forming the boron seed layer comprises exposing the oxide surface to a reactive gas comprising $B_2H_6$ and $H_2$.

3. The method of claim 2, wherein the boron seed layer is deposited by a PECVD process and the reactive gas further comprises Ar, the PECVD process including an RF plasma with a power of less than about 1000 Watt at a pressure in the range of about 2 to about 10 Torr.

4. The method of claim 1, wherein forming the tungsten initiation layer comprises exposing the boron seed layer to a reactive gas comprising $WF_6$, $H_2$ and Ar in a PECVD process including a RF plasma with a power of less than about 1000 Watt at a pressure in the range of about 2 to about 10 Torr.

5. The method of claim 4, wherein the $H_2$ and $WF_6$ in the reactive gas are present in a ratio of about 20:1.

6. The method of claim 4, wherein the tungsten initiation layer has a thickness in the range of about 10 Å to about 100 Å.

7. The method of claim 1, wherein the boron seed layer and the tungsten initiation layer have a combined thickness less than about 300 Å.

8. The method of claim 1, wherein the tungsten containing film further comprises one or more of tungsten metal, tungsten nitride, tungsten boride and tungsten boronitride.

9. The method of claim 1, wherein the boron seed layer has a thickness in a range of about 10 A to about 100 A.

10. A method of forming a tungsten containing film, the method comprising:
    providing a silicon substrate having a silicon oxide surface;

forming a boron seed layer on the silicon oxide surface by a first PECVD process, the boron seed layer having a thickness in the range of about 10 Å to about 200 Å, the PECVD process comprising exposing the silicon oxide surface to a first reactive gas comprising B2H6, H2 and Ar, the PECVD process including a RF plasma generated at a frequency of about 13.56 MHz with a power in the range of about 300 Watt to about 700 Watt and a pressure in the range of about 2 Torr to about 10 Torr;

forming a tungsten initiation layer on the boron seed layer by a second PECVD process, the tungsten initiation layer comprising substantially pure tungsten and having a thickness in the range of about 10 Å to about 200 Å, the second PECVD process comprising exposing the boron seed layer to a second reactive gas comprising WF6, H2 and Ar, the PECVD process including a RF plasma generated at a frequency of about 13.56 MHz with a power in the range of about 300 Watt to about 700 Watt and a pressure in the range of about 2 to about 10 Torr; and forming a tungsten carbide film on the boron seed layer or the tungsten initiation layer by a third PECVD process, the tungsten carbide film having a thickness greater than about 2000 Å, the third PECVD process comprising exposing the tungsten initiation layer to a third reactive gas comprising WF6, H2 and C3H6 with a RF plasma generated at a frequency of about 13.56 MHz with a power in the range of about 300 Watt to about 700 Watt and at a pressure in the range of about 2 to about 10 Torr.

11. The method of claim 10, wherein the boron seed layer and the tungsten initiation layer have a combined thickness less than about 150 Å.

12. The method of claim 10, wherein the $C_3H_6$ in the third reactive gas is ramped up to a final predetermined flow rate over a time in the range of about 2 seconds to about 10 seconds.

* * * * *

UNITED STATES PATENT AND TRADEMARK OFFICE
CERTIFICATE OF CORRECTION

PATENT NO. : 10,529,568 B2  
APPLICATION NO. : 15/406116  
DATED : January 7, 2020  
INVENTOR(S) : Susmit Singha Roy et al.

Page 1 of 1

It is certified that error appears in the above-identified patent and that said Letters Patent is hereby corrected as shown below:

In the Specification

In Column 6, Line 21, after "1:5" and before "about", replace "t" with "to".

In Column 6, Line 61, replace "the the" with "the".

Signed and Sealed this  
Eighteenth Day of February, 2020

Andrei Iancu  
*Director of the United States Patent and Trademark Office*